United States Patent
Li et al.

(10) Patent No.: US 10,128,184 B2
(45) Date of Patent: Nov. 13, 2018

(54) ANTIFUSE STRUCTURE IN VIA HOLE IN INTERPLAYER DIELECTRIC

(71) Applicant: Zhuhai Chuangfeixin Technology Co., Ltd., ZhuHai, Guang Dong Province (CN)

(72) Inventors: Li Li, Fremont, CA (US); Zhigang Wang, Fremont, CA (US)

(73) Assignee: Zhuhai Chuangfeixin Technology Co., Ltd., Zhuhai (CN)

( * ) Notice: Subject to any disclaimer, the term of this patent is extended or adjusted under 35 U.S.C. 154(b) by 140 days.

(21) Appl. No.: 15/089,108

(22) Filed: Apr. 1, 2016

(65) Prior Publication Data
US 2017/0025352 A1    Jan. 26, 2017

(30) Foreign Application Priority Data
Jul. 1, 2015  (CN) .......................... 2015 1 0382110

(51) Int. Cl.
*H01L 21/02*  (2006.01)
*H01L 21/311*  (2006.01)
(Continued)

(52) U.S. Cl.
CPC ........ *H01L 23/5252* (2013.01); *G11C 17/165* (2013.01); *H01L 21/0217* (2013.01); *H01L 21/0228* (2013.01); *H01L 21/02164* (2013.01); *H01L 21/31055* (2013.01); *H01L 21/31111* (2013.01); *H01L 21/7684* (2013.01); *H01L 21/76819* (2013.01); *H01L 21/76831* (2013.01); *H01L 21/76834* (2013.01); *H01L 21/76847* (2013.01); *H01L 23/5226* (2013.01); *H01L 23/5228* (2013.01); *H01L 23/5283* (2013.01); *H01L 23/5329* (2013.01); *H01L 21/02178* (2013.01); *H01L 21/02181* (2013.01); *H01L 21/02183* (2013.01); *H01L 21/02189* (2013.01);
(Continued)

(58) Field of Classification Search
CPC ............. H01L 23/5226; H01L 23/5252; H01L 23/5254; H01L 23/481; H01L 23/49827; H01L 23/5384; G11C 17/143–17/165
See application file for complete search history.

(56) References Cited

U.S. PATENT DOCUMENTS

| 5,550,400 A | * | 8/1996 | Takagi ................ H01L 23/5252 257/530 |
| 5,633,189 A | | 5/1997 | Yen |

(Continued)

OTHER PUBLICATIONS

Chiang et al., "Antifuse structure comparison for field programmable gate arrays," IEEE, 1992, IEDM 92 611-614.
(Continued)

*Primary Examiner* — Kevin Parendo
(74) *Attorney, Agent, or Firm* — Houst Counsulting

(57) ABSTRACT

An antifuse structure includes a first electrode layer, an inter-metal dielectric layer over the first electrode layer, and a via in the inter-metal dielectric layer. The via penetrates through the inter-metal dielectric layer exposing a portion of the first electrode layer. An antifuse layer is deposited in the via and over the portion of the first electrode layer. A second electrode is disposed in the via and over the antifuse layer. An interconnect layer may be deposited over the inter-metal dielectric layer and in electrical contact with the second electrode in the via.

17 Claims, 2 Drawing Sheets

(51) Int. Cl.
  *H01L 21/768* (2006.01)
  *H01L 23/522* (2006.01)
  *H01L 23/525* (2006.01)
  *H01L 23/532* (2006.01)
  *G11C 17/16* (2006.01)
  *H01L 21/3105* (2006.01)
  *H01L 23/528* (2006.01)

(52) U.S. Cl.
  CPC .. *H01L 21/02192* (2013.01); *H01L 23/53219* (2013.01); *H01L 23/53228* (2013.01); *H01L 23/53233* (2013.01); *H01L 23/53261* (2013.01)

(56) References Cited

U.S. PATENT DOCUMENTS

| | | | | |
|---|---|---|---|---|
| 5,679,974 A | * | 10/1997 | Shinriki | H01L 23/5252 257/50 |
| 5,780,323 A | | 7/1998 | Forouhi | |
| 5,962,910 A | | 10/1999 | Hawley | |
| 5,994,757 A | * | 11/1999 | Ichikawa | G11C 17/16 257/104 |
| 6,081,021 A | * | 6/2000 | Gambino | H01L 21/76807 257/209 |
| 6,251,710 B1 | * | 6/2001 | Radens | H01L 23/5252 257/E23.147 |
| 6,498,056 B1 | * | 12/2002 | Motsiff | H01L 23/5252 257/50 |
| 6,509,209 B1 | * | 1/2003 | Shroff | H01L 23/5252 257/E23.002 |
| 6,750,530 B1 | * | 6/2004 | Klaasen | H01L 23/5252 257/530 |
| 7,390,726 B1 | | 6/2008 | Issaq | |
| 2011/0186797 A1 | * | 8/2011 | Herner | G11C 17/16 257/2 |
| 2011/0254122 A1 | * | 10/2011 | Noda | H01L 23/5252 257/530 |
| 2012/0287706 A1 | * | 11/2012 | Lung | H01L 45/06 365/163 |
| 2013/0062728 A1 | * | 3/2013 | Kurz | H01L 23/5252 257/530 |
| 2014/0021581 A1 | * | 1/2014 | Yang | H01L 23/5252 257/530 |

OTHER PUBLICATIONS

Li et al., "Breakdown mechanism of Al2O3 based metal-to-metal antifuse," Solid-State Electronics 44 (2000) 1557-1562.

* cited by examiner

ANTIFUSE STRUCTURE IN VIA HOLE IN INTERPLAYER DIELECTRIC

TECHNICAL FIELD

Embodiments of this disclosure relate generally to electrical devices and methods. In particular, various embodiments of antifuse structures and methods of fabricating antifuse structures are described.

BACKGROUND

Antifuses are known and widely used in programming integrated circuits, including analog and digital circuits, system-on-chips (SOCs), one-time programmable and field programmable gate array (OTP/FPGA), and the like. In general, an antifuse includes a layer of dielectric material, also referred to as an antifuse layer, sandwiched between a pair of electrodes. When un-programmed, an antifuse is non-conductive or in a high resistance state ("off-state"). An antifuse becomes permanently conductive or in a low resistance state ("on-state") when programmed by applying a voltage in excess of the breakdown voltage of the antifuse layer.

In applications, conventional antifuse structures still show relatively high resistance even in the on-state after programming, resulting in high power consumption of the integrated circuit. Furthermore, in fabrication of conventional antifuse structures, the antifuse layer is defined by photolithography and etching processes, which may cause unpredictable misalignment between the antifuse layer and the electrodes.

SUMMARY

In an exemplary embodiment, an antifuse structure comprises a first electrode layer, an inter-metal dielectric layer over the first electrode layer, and a via in the inter-metal dielectric layer. The via penetrates through the inter-metal dielectric layer, exposing a portion of the first electrode layer. An antifuse layer is deposited in the via and over the portion of the first electrode layer. A second electrode is disposed in the via and over the antifuse layer. As such, the second electrode and the antifuse layer can be self-aligned in the via. An interconnect layer may be disposed over the second electrode in the via and the inter-metal dielectric layer. The interconnect layer is in electrical contact with the second electrode in the via.

In an alternative embodiment, an antifuse structure comprises a first interconnect layer, a second interconnect layer, a first inter-metal dielectric layer between the first and second interconnect layers, a first via through the first inter-metal dielectric layer exposing a portion of the first interconnect layer, a first electrode in the first via wherein the first electrode is in electrical contact with the first interconnect layer, a second inter-metal dielectric layer between the first and second interconnect layers and over the first inter-metal dielectric layer, a second via through the second inter-metal dielectric layer wherein the second via is vertically disposed over the first via, an antifuse layer in the second via and over at least a portion of the first electrode, and a second electrode in the second via over the antifuse layer wherein the second electrode is in electrical contact with the second interconnect layer. As such, the second electrode and the antifuse layer can be self-aligned in the via.

In an aspect, the disclosure provides a method of fabricating an antifuse structure. The method comprises forming a first electrode layer, forming an inter-metal dielectric layer over the first electrode layer, etching a via through the inter-metal dielectric layer thereby exposing a portion of the first electrode layer, depositing an antifuse layer in the via at least over the portion of the first electrode layer, and depositing a conductive material in the via to form a second electrode over the antifuse layer. As such, the second electrode and the antifuse layer can be self-aligned in the via. An interconnect layer may be deposited over the inter-metal dielectric layer and the second electrode in the via. The interconnect layer is in electrical contact with the second electrode in the via.

In an alternative embodiment, a method of fabricating an antifuse structure comprises the following steps: forming a first interconnect layer, forming a first inter-metal dielectric layer over the first interconnect layer, etching a first via through the first inter-metal dielectric layer thereby exposing a portion of the first interconnect layer, depositing a first conductive material in the via to form a first electrode wherein the first electrode is in electrical contact with the first interconnect layer, forming a second inter-metal dielectric layer over the first inter-metal dielectric layer and the first electrode in the first via, etching a second via through the second inter-metal dielectric layer wherein the second via is vertically over the first via, depositing an antifuse layer in the second via and over at least a portion of the first plug, depositing a second conductive material in the second via to form a second electrode over the antifuse layer, and forming a second interconnect layer over the second inter-metal dielectric layer and the second electrode in the second via wherein the second interconnect layer is in electrical contact with the second electrode. As such, the second electrode and the antifuse layer can be self-aligned in the via.

This Summary is provided to introduce selected embodiments in a simplified form and is not intended to identify key features or essential characteristics of the claimed subject matter, nor is it intended to be used as an aid in determining the scope of the claimed subject matter. The selected embodiments are presented merely to provide the reader with a brief summary of certain forms the invention might take and are not intended to limit the scope of the invention. Other aspects and embodiments of the disclosure are described in the section of Detailed Description.

BRIEF DESCRIPTION OF THE DRAWINGS

These and various other features and advantages will become better understood upon reading of the following detailed description in conjunction with the accompanying drawings and the appended claims provided below, where:

DETAILED DESCRIPTION

Various embodiments of antifuse structures and methods of fabricating antifuse structures are described. It is to be understood that the disclosure is not limited to the particular embodiments described as such. An aspect described in conjunction with a particular embodiment is not necessarily limited to that embodiment and can be practiced in any other embodiments.

Embodiments of the disclosure may be described with reference to the figures. It should be noted that some figures are not necessarily drawn to scale. The figures are only intended to facilitate the description of specific embodiments, and are not intended as an exhaustive description or as a limitation on the scope of the disclosure. Further, in the following description, specific details such as examples of specific materials, dimensions, processes, etc. may be set forth in order to provide a thorough understanding of the disclosure. It will be apparent, however, to one of ordinary skill in the art that some of these specific details may not be employed to practice embodiments of the disclosure. In other instances, well known components or process steps may not be described in detail in order to avoid unnecessarily obscuring the embodiments of the disclosure.

All technical and scientific terms used herein have the meaning as commonly understood by one of ordinary skill in the art unless specifically defined otherwise. As used in the description and appended claims, the singular forms of "a," "an," and "the" include plural references unless the context clearly dictates otherwise. The term "or" refers to a nonexclusive "or" unless the context clearly dictates otherwise.

Figure 1:
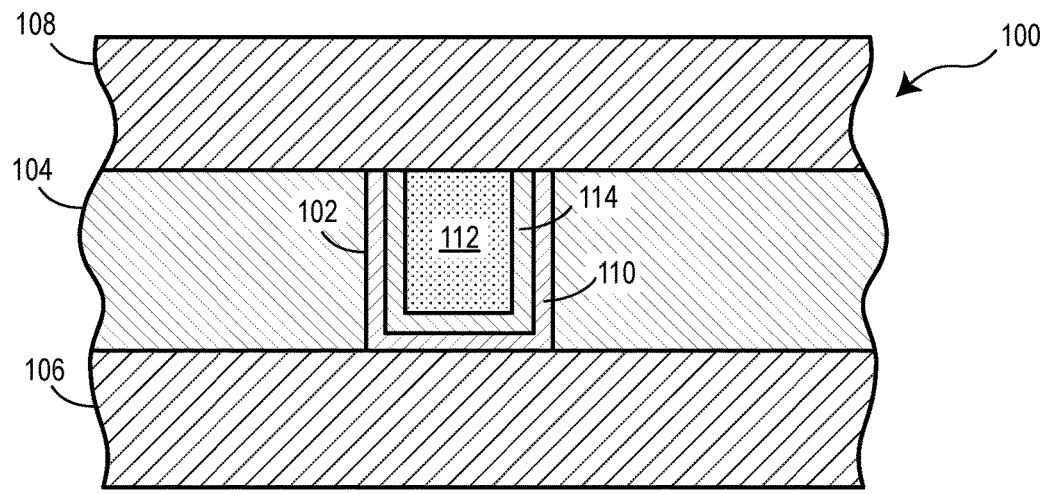
FIG. 1 schematically shows an antifuse structure according to some embodiments of the disclosure.

FIG. 1 schematically shows an antifuse structure 100 according to some embodiments of the disclosure. As shown, the antifuse structure 100 comprises a single vial 102 in an inter-metal dielectric layer (IMD) 104 over a bottom electrode layer 106. An antifuse layer 110 and a top electrode 112 are disposed or self-aligned in the single via 102. An interconnect layer 108 may be disclosed over the top electrode 112 and the IMD layer 104.

The bottom or first electrode layer 106 may be deposited over a substrate (not shown), which may be any insulating layer of an integrated circuit structure. The first electrode layer 106 may be connected to other conducting layers through conducting contacts and vias in the substrate or insulating layer. The first electrode layer 106 may be a single layer of an electrically conductive material such as aluminum-silicon-Cu alloy, Cu, W, Ti, Ta, TiN, TaN, a metal silicide, or the like. Alternatively, the first elect ode layer 106 may be a stack of layers of electrically conductive materials. By way of example, the first electrode layer 106 may comprise a layer of aluminum or aluminum-silicon-Cu alloy, and a barrier layer and/or an adhesion layer atop and/or underneath the layer of aluminum or aluminum-silicon-Cu. Suitable materials for a barrier layer include and are not limited to nitride or carbide of metal Ti or Ta. Suitable materials for an adhesion layer include and are not limited to metal Ti or Ta, or the like. The first electrode layer 106 may be formed using deposition processes known to one of ordinary skill in the art. The thickness of the first electrode layer 106 may range from 500 to 10000 A.

Over the first electrode layer 106 may be deposited an IMD layer 104. Suitable materials for the IMD layer 104 include and are not limited to silicon dioxide, silicon nitride, or silicon oxynitride. The IMD layer 104 may be deposited by CVD or PVD or other suitable deposition processes known to one of ordinary skill in the art. The thickness of the IMD layer 104 may range from 100 to 20000 A.

A via or cell opening 102 may be provided in the IMD layer 104. The via 102 may penetrate through the IMD layer 104, thereby exposing a portion of the first electrode layer 106. The via 102 may be made by an etching process, which may involve patterning the IMD layer using a photoresist, etching, stripping the photoresist, cleaning etc. known to one of ordinary skill in the art. The via 102 may be circular in cross-section with a diameter ranging from 500 to 50000 A. The via 102 may also be in other suitable shapes and sizes.

Next, an antifuse layer 110 is deposited within the via 102. Suitable materials for the antifuse layer 110 include a dielectric film such as silicon oxide, silicon nitride, silicon oxynitride, amorphous silicon, or the like. In some preferred embodiments, the antifuse layer 110 includes a high K dielectric material having a dielectric constant equal to or greater than 8. Suitable high K dielectric materials include and are not limited to $HfO_2$, $Al_2O_3$, $ZrO_2$, $Ta_2O_5$, $La_2O_3$. The antifuse layer may be a single layer of a dielectric material or a stack of layers of dielectric materials. By way of example, the antifuse layer may include one or more layers of $SiO_2$, $Si_3N_4$, silicon oxynitride, or amorphous silicon, and one or more layers of $HfO_2$, $Al_2O_3$, $ZrO_2$, $Ta_2O_5$, and $La_2O_3$. The antifuse layer may be formed by an atomic layer deposition (ALD) process known to one of ordinary skill in the art. The thickness of the antifuse layer may be smaller than 1000 A, preferably smaller than 500 A, more preferably smaller than 100 A. The antifuse layer deposited may have a step coverage greater than 80%, preferably greater than 90%, more preferably greater than 95%.

Next, an electrically conductive material may be deposited in the via 102 to form a top or second electrode 112. The second electrode 112 may fill the via in the form of a plug. Suitable conductive materials include and are not limited to aluminum-silicon-Cu alloy, Cu, W, Ti, Ta, TiN, TaN, a metal silicide, or the like. The second electrode 112 may comprise a single layer or a stack of layers of electrically conductive materials. The second electrode plug 112 may be deposited using ALD, CVD or other deposition processes known to one of ordinary skill in the art.

Before depositing the second electrode 112, a conductive barrier layer and/or adhesion layer 114 may be optionally deposited over the antifuse layer 110 in the via 102. Suitable materials for a barrier layer include and are not limited to nitride or carbide of metal Ti or Ta. Suitable materials for an adhesion layer include and are not limited to metal Ti, Ta, or the like.

A polishing process such as chemical mechanical polishing (CMP) or bulk etch without lithography may be performed to remove the materials of the antifuse layer, the second electrode, and optionally the barrier layer and/or adhesion layer off the top surface of the IMD layer 104. The polishing process ensures that the antifuse layer 110, the second electrode 112, and optionally the barrier layer and/or adhesion layer 114 are kept within the via 102. This allows a self-alignment of the antifuse layer 110 and the second electrode 112, and optionally the barrier layer and/or adhesion layer 114 by virtue of the via 102 in the IMD layer 104.

An interconnect layer 108 may be deposited after the polishing process. The interconnect layer 108 may be an extension of the second electrode 112 or otherwise electrically connected with the second electrode 112. The interconnect layer 108 may be a single layer of an electrically conductive material such as aluminum-silicon-Cu alloy, Cu, W, Ti, Ta, TiN, TaN, a metal silicide, or the like. The interconnect layer 108 may also be a stack of layers of electrically conductive materials. By way of example, the interconnect layer 108 may comprise a layer of aluminum or aluminum-silicon-Cu alloy, and a barrier layer and/or an adhesion layer atop and/or underneath the layer of aluminum or aluminum-silicon-Cu. Suitable materials for a barrier layer include and are not limited to nitride or carbide of metal Ti or Ta. Suitable materials for an adhesion layer include and are not limited to metal Ti, Ta, or the like. The second electrode layer may be formed using deposition processes known to one of ordinary skill in the art. The thickness of the second electrode layer may range from 500 to 10000 A.

Figure 2:
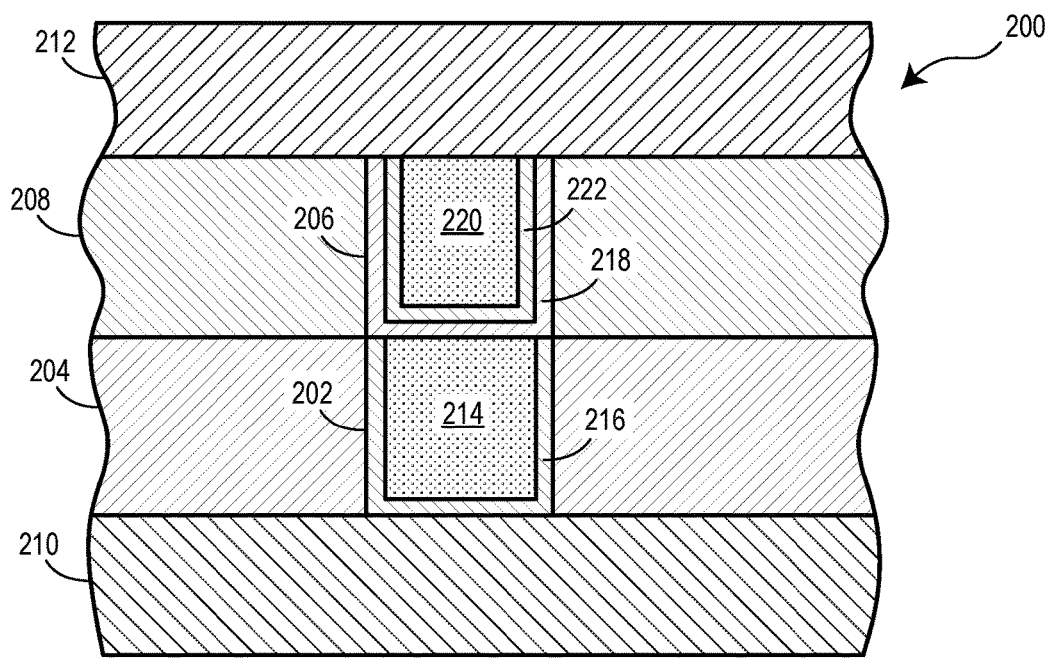
FIG. 2 schematically shows an antifuse structure according to alternative embodiments of the disclosure.

FIG. 2 schematically shows an antifuse structure 200 according to some alternative embodiments of the disclosure. As shown, the antifuse structure 200 has a dual via configuration, a first via 202 in a first IMD layer 204 and a second via 206 in a second IMD layer 208. The first and second vias 202, 204 are vertically disposed over each other. A first electrode 214 is disposed in the first via 202 and a second electrode 220 is disposed in the second via 206.

A first interconnect layer 210 may be deposited over a substrate (not shown), which may be any insulating layer of an integrated circuit structure. The first interconnect layer 210 may be connected to other conducting layers through contacts and vias in the substrate or insulating layer. The first interconnect layer 210 may be a suitable electrically conductive material such as aluminum-silicon-Cu alloy, Cu, W, Ti, Ta, TiN, TaN, a metal silicide, or the like. The first interconnect layer 210 may be a single layer or a stack of layers of electrically conductive materials. For example, the first interconnect layer 210 may comprise a layer of aluminum or aluminum-silicon-Cu alloy, and a barrier layer and/or an adhesion layer atop and/or underneath the layer of aluminum or aluminum-silicon-Cu. Suitable materials for a barrier layer include and are not limited to nitride or carbide of metal Ti or Ta. Suitable materials for an adhesion layer include and are not limited to metal Ti, Ta, or the like. The first interconnect layer 210 may be formed using deposition processes known to one of ordinary skill in the art. The thickness of the first interconnect layer 210 may range from 500 to 10000 A.

Over the first electrode layer 210 may be deposited a first IMD layer 204. Suitable materials for the first IMD layer include and are not limited to silicon dioxide, silicon nitride, or silicon oxynitride. The first IMD layer 204 may be deposited by CVD or PVD or other suitable deposition processes known to one of ordinary skill in the art. The thickness of the first IMD layer 204 may range from 100 to 20000 A.

The first via 202 is provided in the first IMD layer 204. The first via 202 may penetrate through the first IMD layer 204, thereby exposing a portion of the first interconnect layer 210. The first via 202 may be made by an etching process, which may involve patterning the IMD layer 204 using a photoresist, etching, stripping the photoresist, cleaning etc. known to one of ordinary skill in the art. The first via 202 may be in the shape having a circular cross-section with a diameter ranging from 500 to 50000. The first via 202 may also be in other suitable shapes and sizes.

An electrically conductive material is deposited in the first via 202 to form the first electrode 214. The first electrode 214 may fill the first via 202 in the form of a plug. Suitable electrically conductive materials include and are not limited to aluminum-silicon-Cu alloy, Cu, W, Ti, Ta, TiN, TaN, a metal silicide, or the like. The first electrode 214 may comprise a single layer or a stack of layers of electrically conductive materials. The first electrode 214 may be deposited using ALD, CVD or other deposition processes known to one of ordinary skill in the art.

Before depositing the first electrode 214, a barrier layer and/or adhesion layer 216 may be deposited in the first via 202. Suitable materials for a barrier layer include and are not limited to nitride or carbide of metal Ti or Ta. Suitable materials for an adhesion layer include and are not limited to metal Ti, Ta, or the like.

A polishing process such as chemical mechanical polishing (CMP) or bulk etch without lithography may be performed to remove the materials of the first electrode and optionally the barrier layer and/or adhesion layer off the top surface of the first IMD layer 204. A second IMD layer 208 is deposited over the first IMD 204 and the first electrode 214 in the first via 202.

A second IMD layer 208 is next deposited over the first IMD layer 208 and the first electrode 214 in the first via 202. Suitable materials for the second IMD layer 208 include and are not limited to silicon dioxide, silicon nitride, or silicon oxynitride. The second IMD layer may be deposited by CVD or PVD or other suitable deposition processes known to one of ordinary skill in the art. The thickness of the second IMD layer may range from 100 to 20000 A.

A second via 206 is then provided in the second IMD layer 208. The second via 206 may penetrate through the second IMD layer 208, thereby exposing at least a portion of the first plug 214. The second via 206 may be made by an etching process, which may involve patterning the second IMD layer 208 using a photoresist, etching, stripping the photoresist, cleaning etc. known to one of ordinary skill in the art. The second via 206 may be circular in cross-section with a diameter ranging from 500 to 50000. The second via 206 may also be in other suitable shapes and sizes. The shape and size of the second via 206 may be substantially same as the shape and size of the first via 202.

An antifuse layer 218 is deposited within the second via 206. Suitable materials for the antifuse layer 218 include a dielectric film such as silicon oxide, silicon nitride, silicon oxynitride, amorphous silicon, or the like. In some preferred embodiments, the antifuse layer 218 includes a high K dielectric material having a dielectric constant equal to or greater than 8. Suitable high K dielectric materials include and are not limited to $HfO_2$, $Al_2O_3$, $ZrO_2$, $Ta_2O_5$, $La_2O_3$. The antifuse layer 218 may be a single layer of a dielectric material or a stack of layers of dielectric materials. By way of example, the antifuse layer may include one or more layers of $SiO_2$, $Si_3N_4$, silicon oxynitride, or amorphous silicon, and one or more layers of $HfO_2$, $Al_2O_3$, $ZrO_2$, $Ta_2O_5$, or $La_2O_3$. The antifuse layer 218 may be formed by an atomic layer deposition (ALD) process known to one of ordinary skill in the art. The thickness of the antifuse layer 218 may be smaller than 1000 A, preferably smaller than 500 A, more preferably smaller than 100 A. The antifuse layer deposited may have a step coverage greater than 80%, preferably greater than 90%, more preferably greater than 95%.

An electrically conductive material is deposited in the second via 206 to form a second electrode 220. The second electrode 220 may fill the second via 206 in the form of a plug. Suitable electrically conductive materials include and are not limited to aluminum-silicon-Cu alloy, Cu, W, Ti, Ta, TiN, TaN, a metal silicide, or the like. The second electrode 220 may comprise a single layer or a stack of layers of electrically conductive materials. The second electrode 220 may be deposited using ALD, CVD or other deposition processes known to one of ordinary skill in the art. The second electrode 220 may have a cross-sectional size substantially same as or smaller than the cross-sectional size of the first electrode 214.

Before depositing the second electrode 220, a barrier layer and/or adhesion layer 222 may be deposited in the second via 206 over the antifuse layer 218. Suitable materials for a barrier layer include and are not limited to nitride or carbide of metal Ti or Ta. Suitable materials for an adhesion layer include and are not limited to metal Ti, Ta, or the like.

A polishing process such as chemical mechanical polishing (CMP) or bulk etch without lithography may be performed to remove the materials of the antifuse layer, the second plug, and optionally the barrier layer and/or adhesion layer off the top surface of the second IMD layer 208. The polishing process ensures that the antifuse layer 218, the second electrode 220, and optionally the barrier layer and/or adhesion layer 222 are kept within the second via. This allows a self-alignment of the antifuse layer 218 and the second electrode 220, and optionally the barrier layer and/or adhesion layer 222 by virtue of the second via 206 in the second IMD layer 208.

A second interconnect layer 212 may be deposited after the planarization process. Similar to the first interconnect layer 210, the second interconnect layer 212 may be a single layer of an electrically conductive material such as aluminum-silicon-Cu alloy, Cu, W, Ti, Ta, TiN, TaN, a metal silicide, or the like. Alternatively, the second interconnect layer 212 may be a stack of layers of electrically conductive materials. By way of example, the second interconnect layer 212 may comprise a layer of aluminum or aluminum-silicon-Cu alloy, and a barrier layer and/or an adhesion layer atop and/or underneath the layer of aluminum or aluminum-silicon-Cu. Suitable materials for a barrier layer include and are not limited to nitride or carbide of metal Ti or Ta. Suitable materials for an adhesion layer include and are not limited to metal Ti or Ta, or the like. The second interconnect layer 212 may be formed using deposition processes known to one of ordinary skill in the art. The thickness of the second electrode layer 212 may range from 500 to 10000 A.

Figure 3:
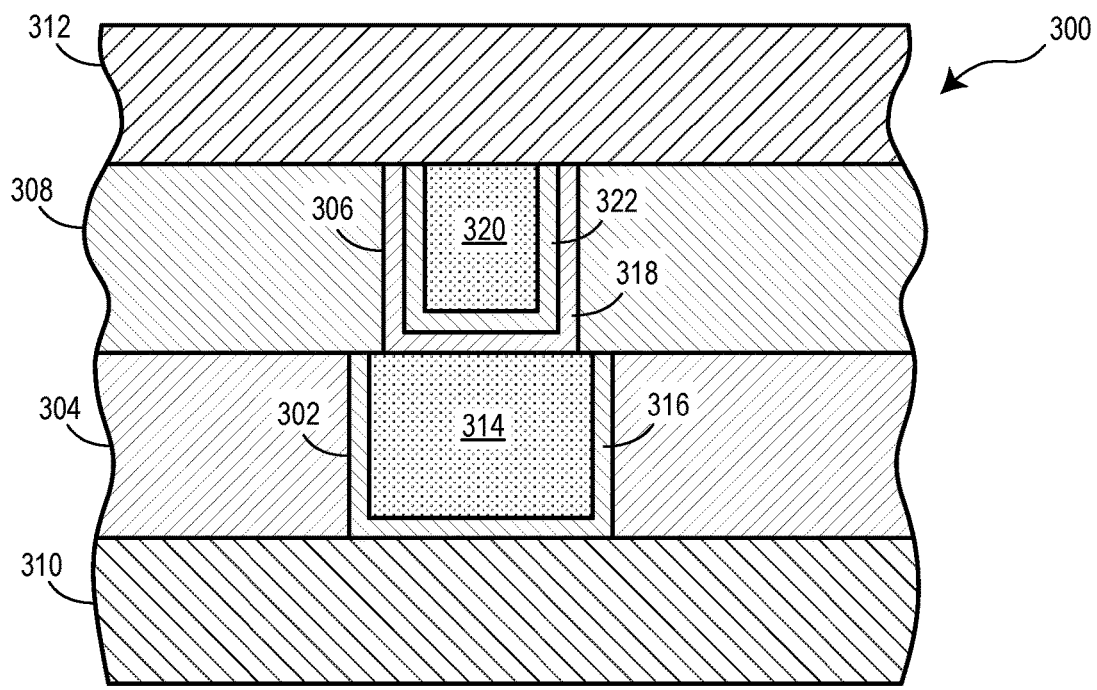
FIG. 3 schematically shows an antifuse structure according to alternative embodiments of the disclosure.

FIG. 3 schematically shows an antifuse structure 300 according to some alternative embodiments of the disclosure. The antifuse structure 300 shown in FIG. 3 is similar to the antifuse structure 200 shown in FIG. 2 in many aspects. For example, the antifuse structure 300 shown in FIG. 3 also has a dual via configuration, a first via 302 in a first IMD layer 304 and a second via 306 in a second IMD layer 308. The first and second vias 302, 304 are vertically disposed over each other between two interconnect layers 310, 312. In the first via 302, a first electrode 314 is deposited. A barrier layer and/or adhesion layer 316 may be deposited in the first via 302 before the first electrode 314 is deposited and fills the first via 302. In the second via 306, an ALD antifuse layer 318 is deposited. Suitable materials for the antifuse layer include $SiO_2$, $Si_3N_4$, silicon oxynitride, or amorphous silicon and/or a dielectric film or preferably a high K dielectric material having a dielectric constant equal to or greater than 8 as discussed above. The thickness of antifuse layer 318 of high K dielectric materials may be smaller than 1000 A, preferably smaller than 500 A, more preferably smaller than 100 A. The antifuse layer deposited may have a step coverage greater than 80%, preferably greater than 90%, more preferably greater than 95%. A second electrode 320 is deposited in the second via 306. A polishing process such as chemical mechanical polishing (CMP) may be performed to remove the materials of the antifuse layer, the second electrode, and optionally the barrier layer and/or adhesion layer off the top surface of the IMD layer 308. A barrier layer and/or adhesion layer 322 may be deposited over the antifuse layer 318 before the second electrode 320 is deposited and fills the first via 306.

One difference between the antifuse structures 200 and 300 is that in the antifuse structure 300 of FIG. 3, the size of second via 306 in the second IMD layer 308 is smaller than the size of the first via 302 in the first IMD layer 304, whereas in the antifuse structure 200 of FIG. 2, the size of the second via 206 in the second IMD layer 208 is substantially the same as the size of the first via 202 in the first IMD layer 204. Therefore, while in the antifuse structure 200 of FIG. 2 both the first electrode 214 and the barrier and/or adhesion layer 216 are in contact with the antifuse layer 218 in the second via 206 and involved in breakdown process of the antifuse layer 218, in the antifuse structure 300 of FIG. 3, only a portion of the first electrode 314 is in contact with the antifuse layer 318 in the second via 306 and involved in breakdown process of the antifuse layer 318.

Figure 4:
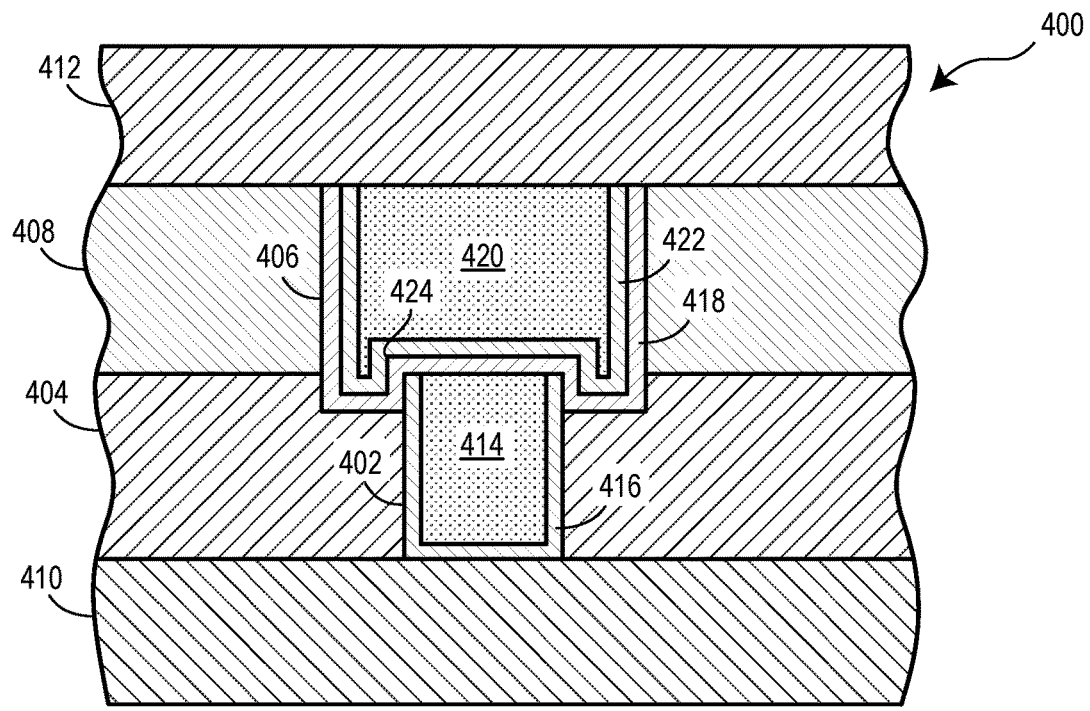
FIG. 4 schematically shows an antifuse structure according to alternative embodiments of the disclosure.

FIG. 4 schematically shows an antifuse structure 400 according to some further alternative embodiments of the disclosure. The antifuse structure 400 shown in FIG. 4 is similar to the antifuse structure 200 shown in FIG. 2 in many aspects. For example, the antifuse structure 400 shown in FIG. 4 also has a dual via configuration, a first via 402 in a first IMD layer 404 and a second via 406 in a second IMD layer 408. The first and second vias 402, 406 may be vertically disposed over each other between two interconnect layers 410, 412. In the first via 402, a first electrode 414 is deposited. A barrier layer and/or adhesion layer 416 may be deposited in the first via 402 before the first electrode 414 is deposited and fills the first via 402. In the second via 406, an ALD antifuse layer 418 is deposited. Suitable materials for the antifuse layer 418 include a dielectric film such as $SiO_2$, $Si_3N_4$, silicon oxynitride, or amorphous silicon, or preferably a high K dielectric material having a dielectric constant equal to or greater than 8 as discussed above. The thickness of the antifuse layer 418 may be smaller than 1000 A, preferably smaller than 500 A, more preferably smaller than 100 A. The antifuse layer deposited may have a step coverage greater than 80%, preferably greater than 90%, more preferably greater than 95%. A second electrode 420 is deposited in the second via 406. A polishing process such as chemical mechanical polishing (CMP) or bulk etch without lithography may be performed to remove the materials of the antifuse layer, the second electrode, and optionally the barrier layer and/or adhesion layer off the top surface of the IMD layer 416. A barrier layer and/or adhesion layer 422 may be deposited over the antifuse layer 418 before the second electrode 420 is deposited and fills the first via 406.

One difference between the antifuse structures 200 and 400 is that in the antifuse structure 400 of FIG. 4, the size of second via 406 in the second IMD layer 408 is greater than the size of the first via 402 in the first IMD layer 404, whereas in the antifuse structure 200 shown in FIG. 2, the size of the second via 206 in the second IMD layer 208 is substantially the same as the size of the first via 202 in the first IMD layer 204. A portion of the second via 406 may extend into the first IMD layer 404, such that a top portion of the first via 402 may be surrounded by the second via 406. The antifuse layer 418 in the second via 406 may have steps 424 forming a recess at the bottom section of the antifuse layer 418. In the antifuse structure 400 shown in FIG. 4, the breakdown of the antifuse and conductive channel formation more likely occur at the corner intersecting the steps 424.

Embodiments of antifuse structures and methods of fabricating antifuse structures are described. Those skilled in the art will appreciate that various other modifications may be made within the spirit and scope of the invention. All these or other variations and modifications are contemplated by the inventors and within the scope of the invention.

What is claimed is:

1. An antifuse structure, comprising:
   a first interconnect layer;

a second interconnect layer;

a first inter-metal dielectric layer between the first and second interconnect layers;

a first via through the first inter-metal dielectric layer, exposing a portion of the first interconnect layer;

a first electrode in the first via, the first electrode being in electrical contact with the first interconnect layer;

a second inter-metal dielectric layer between the first and second interconnect layers and over the first inter-metal dielectric layer, wherein the second inter-metal dielectric layer has a bottom surface proximal to the first inter-metal dielectric layer and a top surface distal to the first inter-metal dielectric layer;

a second via through the second inter-metal dielectric layer, wherein the second via having a side wall and being vertically disposed over the first via;

an antifuse layer in the second via and over at least a portion of the first electrode; and a second electrode in the second via over the antifuse layer, the second electrode being in electrical contact with the second interconnect layer, wherein the antifuse layer and the second electrode are confined within the second via, wherein the antifuse layer consists of a bottom section and a sidewall section covering the side wall of the second via, the bottom section being leveled with the bottom surface of the second inter-metal dielectric layer, the sidewall section having a top end leveled with the top surface of the second inter-metal dielectric layer, the bottom and sidewall sections of the antifuse layer defining a geometry to receive the second electrode, and wherein the second electrode has a top surface leveled with the top surface of the second inter-metal dielectric layer and is in electrical contact with the second interconnect layer.

2. The antifuse structure of claim 1, wherein the second via has a cross-sectional dimension equal to a cross-sectional dimension of the first via.

3. The antifuse structure of claim 1, wherein the second via has a cross-sectional dimension smaller than a cross-sectional dimension of the first via.

4. The antifuse structure of claim 1, wherein the second via has a cross-sectional dimension greater than a cross-sectional dimension of the first via.

5. The antifuse structure of claim 4, wherein the second via extends into a portion of the first inter-metal dielectric layer, and wherein the antifuse layer has a bottom section with recessed steps surrounding a top portion of the first via.

6. The antifuse structure of claim 1, wherein the antifuse layer comprises ALD $SiO_2$ and/or $Si_3N_4$.

7. The antifuse structure of claim 1, wherein the antifuse layer comprises a high K dielectric material having a dielectric constant greater than 8.

8. The antifuse structure of claim 7, wherein the antifuse layer comprises an ALD high K dielectric material.

9. The antifuse structure of claim 8, wherein the antifuse layer comprises $HfO_2$, $Al_2O_3$, $ZrO_2$, $Ta_2O_5$, or $La_2O_3$, or any combination thereof.

10. The antifuse structure of claim 8, wherein the antifuse layer has a thickness smaller than 1000 Angstroms.

11. The antifuse structure of claim 1, wherein the antifuse layer has a thickness smaller than 100 Angstroms.

12. The antifuse structure of claim 1, wherein the antifuse layer comprises a stack of dielectric films.

13. The antifuse structure of claim 12, wherein the stack of dielectric films comprises one or more layers of ALD $SiO_2$, $Si_3N_4$, silicon oxynitride, and amorphous silicon, and one or more layers of ALD $HfO_2$, $Al_2O_3$, $ZrO_2$, $Ta_2O_5$, or $La_2O_3$.

14. The antifuse structure of claim 1, wherein the antifuse layer has a step coverage greater than 80%.

15. The antifuse structure of claim 1, wherein the antifuse layer has a step coverage greater than 95%.

16. The antifuse structure of claim 1, further comprising a conductive adhesion layer and/or a barrier layer between the first electrode and the first interconnect layer.

17. The antifuse structure of claim 1, further comprising a conductive adhesion layer and/or a barrier layer between the second electrode and the antifuse layer.

* * * * *